United States Patent [19]
Lei et al.

[11] Patent Number: 5,516,367
[45] Date of Patent: May 14, 1996

[54] CHEMICAL VAPOR DEPOSITION CHAMBER WITH A PURGE GUIDE

[75] Inventors: Lawrence C. Lei, Cupertino; Ilya Perlov, Santa Clara; Karl A. Littau, Sunnyvale; Alan F. Morrison, San Jose; Mei Chang, Cupertino; Ashok K. Sinha, Palo Alto, all of Calif.

[73] Assignee: Applied Materials, Inc., Santa Clara, Calif.

[21] Appl. No.: 342,670

[22] Filed: Nov. 21, 1994

Related U.S. Application Data

[63] Continuation of Ser. No. 42,961, Apr. 5, 1993, abandoned.

[51] Int. Cl.$^6$ .................................................. C23C 16/00
[52] U.S. Cl. ........................ 118/725; 118/715; 118/720; 118/724
[58] Field of Search ................................. 118/715, 720, 118/724, 725

[56] References Cited

U.S. PATENT DOCUMENTS

| | | | |
|---|---|---|---|
| 4,209,357 | 6/1980 | Gorin et al. | 156/643 |
| 4,579,618 | 4/1986 | Celestino et al. | 156/345 |
| 4,585,920 | 4/1986 | Hoog et al. | 156/345 |
| 4,872,947 | 10/1989 | Wang et al. | 156/643 |
| 4,892,753 | 1/1990 | Wang et al. | 427/38 |
| 4,951,601 | 8/1990 | Maydan et al. | 118/719 |
| 5,198,034 | 3/1993 | deBoer et al. | 118/725 |
| 5,228,501 | 7/1993 | Tepman et al. | |
| 5,231,690 | 7/1993 | Soma et al. | 392/416 |
| 5,238,499 | 8/1993 | van de Ven et al. | 118/724 |

FOREIGN PATENT DOCUMENTS

| | | |
|---|---|---|
| 467623A3 | of 0000 | European Pat. Off. ........ C23C 16/54 |
| 913036281 | 4/1991 | European Pat. Off. . |
| 0456372A1 | 4/1991 | European Pat. Off. . |
| 0467623A2 | 7/1991 | European Pat. Off. . |
| WO9013687 | 11/1990 | Netherlands . |

*Primary Examiner*—Robert Kunemund
*Assistant Examiner*—Ramamohan Rao Paladugu
*Attorney, Agent, or Firm*—Michael B. Einschlag; B. Todd Patterson

[57] ABSTRACT

Vacuum CVD chambers are disclosed which provide a more uniformly deposited thin film on a substrate. The chamber susceptor mount for the substrate is heated resistively with a single coil firmly contacting the metal of the susceptor on all sides, providing uniform temperatures across the susceptor mount for a substrate. A purge gas line is connected to openings in the susceptor outside of the periphery of the substrate to prevent edge and backside contamination of the substrate. A vacuum feed line mounts the substrate to the susceptor plate during processing. A refractory purge guide, or a plurality of placement pins, maintain a fixed gap passage for the purge gases to pass alongside the edge of the wafer and into the processing area of the chamber. An exhaust pumping plate improves the uniformity of exhaustion of spent gases from the chamber.

47 Claims, 5 Drawing Sheets

CHEMICAL VAPOR DEPOSITION CHAMBER WITH A PURGE GUIDE

This application is a Continuation of U.S. patent application Ser. No. 08/042,961, filed Apr. 5, 1993 now abandoned.

This invention relates to an improved chemical vapor deposition (CVD) chamber. More particularly, this invention relates to a CVD vacuum chamber which deposits thin films more uniformly onto a semiconductor substrate.

BACKGROUND OF THE INVENTION

CVD vacuum chambers are employed to deposit thin films on semiconductor substrates. A precursor gas is charged to a vacuum chamber through a gas manifold plate situate above the substrate, which substrate is heated to process temperatures, generally in the range of about 250°–650° C. The precursor gas reacts on the heated substrate surface to deposit a thin layer thereon and to form volatile by-product gases, which are pumped away through the chamber exhaust system.

To increase manufacturing efficiency and device capabilities, the size of devices formed on a substrate has decreased, and the number of devices formed on a substrate has increased in recent years. Thus it is increasingly important that CVD deposited thin films be of uniform thickness across the substrate, so that all of the devices on the substrate are uniform. Further, it is increasingly important that the generation of particles in processing chambers be avoided to reduce contamination of substrates that will reduce the yield of good devices.

Further, the size of semiconductor substrates, e.g., silicon wafers, has increased so that the present state-of-the-art silicon wafers are about 8 inches in diameter. This makes it feasible to process only one wafer at a time in a processing chamber, as opposed to batch-type processes that process a plurality, up to 100 wafers, at a time. The economies of batch processing are reduced using large wafers because if there is a problem during processing, many expensive wafers are damaged and must be discarded. Further, the processing chambers can be made smaller when only one substrate is to be processed at a time, and the processing is more controllable.

Still further, equipment has been developed to automate wafer processing by performing several sequences of processing steps without removing the wafer from a vacuum environment, thereby reducing transfer times and contamination of wafers. Such a system has been disclosed for example by Maydan et al, U.S. Pat. No. 4,951,601, in which a plurality of processing chambers are connected to a transfer chamber. A robot in a central transfer chamber passes wafers through slit valves in the various connected processing chambers and retrieves them after processing in the chambers is complete.

A typical prior art CVD chamber is disclosed in FIG. 1. This chamber is described in U.S. Pat. No. 4,892,753 to Wang et al, incorporated herein by reference. Referring to FIG. 1, a susceptor 16 on which a wafer 14 is mounted during processing is movable vertically in the chamber 10 by means of a vertically moveable elevator (not shown). A plurality of pins 20 support the wafer as the wafer is brought into the chamber from an external robot blade. A plurality of susceptor support fingers 22 are connected to the wafer fingers 20 and are mounted on a bar 40, which is also vertically moveable by the elevator. The wafer 14 and the susceptor 16 on which it is mounted are heated by a plurality of high intensity lamps 58 through a light transmissive quartz window 70. In a preferred configuration, two banks of lamps are located outside both the top and the bottom of the chamber 10, when there are two sets of quartz windows 70. These quartz windows 70 are sealed to the chamber walls by means of Teflon seals 72. The use of these external heating lamps 58 allows very rapid heating of wafers and susceptors, and allows the chamber to be cooled between processing cycles when the lamps are turned off.

However, the quartz windows 70 have a comparatively short lifetime; after about 1000–2000 deposition cycles, sufficient deposition occurs on the quartz windows so that they cloud over, and the light from the high intensity lamps can no longer penetrate the quartz windows 70, when they must be cleaned. The quartz windows are also attached by flourine-containing plasma used to clean the chamber, which also generates particles. A flow of purge gas across the windows 70 has extended the period between cleanings, but the downtime required for cleaning or replacement of the windows 70 is still expensive.

In addition, the high intensity lamps 58 must be periodically replaced as well, causing additional downtime of the equipment.

Another problem with the use of the prior art CVD chambers is that they take a long time, up to about 6 hours, to degas so as to maintain a low leakage rate in the chamber. The Teflon seals 72 used to seal the quartz windows 70 are helium permeable, and outgas slowly, and it takes a long period of time for the chamber 10 to reach a satisfactory vacuum integrity. The present standards for chamber leakage require that the pressure inside the chamber 10 be brought to 72 millitorr, and the temperature increased to 450° C. when the vacuum is shut off. The increase in pressure in the chamber is then monitored. A leakage rate of no more than 0.5 millitorr per minute is the present standard.

Such CVD chambers are used to deposit metals, such as tungsten, from $WF_6$ precursor gas. $WF_6$ is a highly volatile gas, and problems have arisen because tungsten deposits not only on the topside of the wafer, but also on the edge surfaces and backside of the wafer. These edge and backside surfaces are rougher than the highly polished top surface, and are not coated with an adhesive layer such as sputtered titanium nitride, and thus the deposited materials tend to flake off the edge and bottom surfaces, contaminating the chamber. The excess deposits can be etched off in an etch plasma, using the same or a different chamber, but this process itself may form particles in the chamber or damage the backside of the wafers.

Thus clamping rings have come into use. Clamping rings cover the periphery of the wafer during deposition, thereby preventing the deposition gases from reaching the edge and backside surfaces of the wafer. However, due to the volatility of $WF_6$ for example, clamping rings alone do not prevent edge and backside deposition on the wafer. The use of a purge gas directed behind or at the edge of the wafer behind the clamping ring has also been tried. The purge gas exerts a positive pressure that reduces the chance that processing gas will reach these edge and backside surfaces.

The use of clamping rings has several disadvantages however; the clamping ring is raised and lowered during the processing cycle, and can rub against the susceptor and the wafer, thereby causing particle generation. In addition, clamping rings overlie the peripheral surface of the wafer, reducing the area of the wafer on which metal can be deposited.

Another problem with the use of clamping rings is that the clamping ring, because it is thicker than the wafer, remains cooler than the wafer, and cools the periphery of the wafer where it is in contact with the clamping ring. This causes a drop in deposition rate at the cooler periphery of the wafer, and leads to non-uniformities in the deposited film.

Thus, despite the use of all of these features, the deposition of metals such as tungsten by CVD is not as uniform as desired. The use of banks of external high intensity lamps to heat the susceptor and the wafer is not entirely uniform, leading to non-homogeneities in the deposited film. Further, deposits of tungsten and other materials onto the quartz windows builds up over time, reducing the transparency of the windows, so that they must be periodically cleaned. This necessitates opening the chamber and increases downtime, which is expensive. Other problems of particle generation and non-uniform deposition have been noted with the present chambers. Thus the search for the causes of particle generation and non-uniformities in deposited films has continued and solutions to the above problems are being sought continually.

SUMMARY OF THE INVENTION

The present invention comprises a single substrate CVD chamber for deposition of, inter alia, tungsten, both blanket and selectively deposited, tungsten silicide, titanium nitride, copper and the like, which chamber provides improved uniformity of the deposited films. The CVD chamber of the invention includes a susceptor that is resistively heated using a single coil resistance heater firmly embedded in the susceptor so as to continually and uniformly heat the substrate mounted thereon; a vacuum line through the susceptor that mounts the substrate firmly against the susceptor during processing thereof, thereby at least partially preventing backside deposition on the substrate and enhancing heat transfer from the heated susceptor to the substrate; a purge gas line through said susceptor at its periphery to prevent process gases from reaching the bottom edge and backside of the wafer; and a refractory purge guide mounted on said susceptor which maintains a uniform gap above the substrate. The purge guide of the invention does not contact the substrate during processing, thereby eliminating a source of temperature reduction at the periphery of the substrate and temperature non-uniformities across the substrate, and limiting the amount of purge gas that passes into the processing portion of the chamber. In addition, improved optional features of the present CVD chamber include a source of inert gas in the vacuum line to control center to edge temperature uniformity of the substrate; and an optional chamber vacuum exhaust plate that improves the uniformity of exhaustion of excess and by-product gases from the chamber.

The present resistively heated susceptor can maintain a center to edge temperature uniformity of +/–2° C.

DETAILED DESCRIPTION OF THE INVENTION

In the Figures, the same number is used throughout for the same part in all of the Figures.

Figure 1:
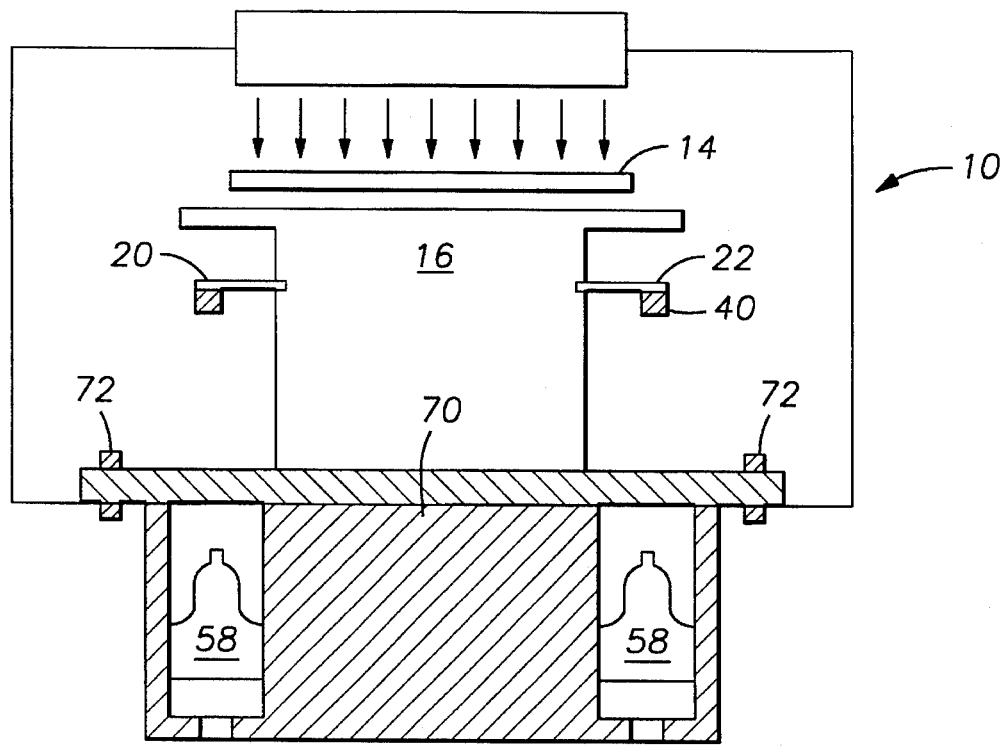
FIG. 1 is a cross sectional, partially schematic view of a CVD chamber of the prior art.
Figure 2A:
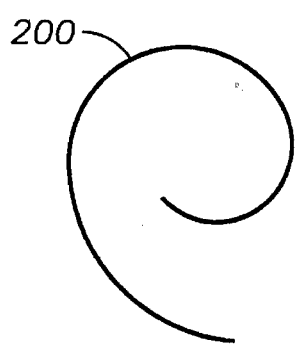
FIG. 2A is a top view of a coil useful herein.
Figure 2B:
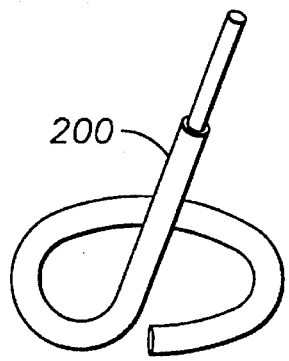
FIG. 2B is a three dimensional view of the coil of FIG. 2A.
Figure 3:
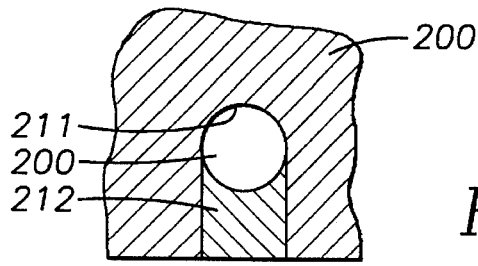
FIG. 3 is a cross sectional view of a coil embedded in a susceptor mount.

We have found that a resistively heated susceptor mount for substrates during CVD processing has advantages over high intensity lamp heating for single substrate CVD processing chambers. The resistance heater of the invention comprises a single coil resistance heater 200, on the order of 8.1 KW, as shown in FIGS. 2A and 2B. The susceptor mount 210 comprises a block of metal, e.g., aluminum, that has a single coil resistance heater 200, embedded therein as shown in FIG. 3. In order to provide uniform heating of the susceptor support for the substrate and to uniformly heat the substrate mounted thereon, the coil must be in contact with the bulk of the susceptor mount 210 on all sides. FIG. 3 is a cross sectional view of a coil 200 embedded in a susceptor mount 210 with an aluminum press fit fitting 212 to ensure that the coil 200 is in contact with metal on all sides. To make the susceptor mount 210 of the invention, a space 211 for a heater coil is machined out of the solid susceptor mount 210, the coil 200 is inserted therein, and an aluminum plate 212 is press fitted against the coil 200 so that the coil 200 is in contact with the metal susceptor mount 210 on all sides. It is then welded to permit the heater coil to remain at atmospheric pressure to enhance heat transfer. This is important to ensure uniform heating of the susceptor mount 210. Alternatively, an aluminum susceptor mount with a coil embedded therein can be made by a casting process.

Since the coil 200 is in contact with aluminum metal on all sides, e.g., the susceptor 210 and the metal fitting 212, high power density can be achieved without a large number of coils, and, in fact, high density power can be obtained and uniform resistance heating of the susceptor mount 210 obtained with only a single heating coil 200, as shown in FIG. 2. This reduces the required size of the susceptor mount 210 and allows a variety of gas distribution channels therein to be implemented. A wafer, vacuum mounted on the susceptor mount 210, can be rapidly heated uniformly using the above described heater assembly. The center to edge temperature variation on the substrate is no more than 2° C. at processing temperatures of, e.g., about 475° C.

Figure 7:
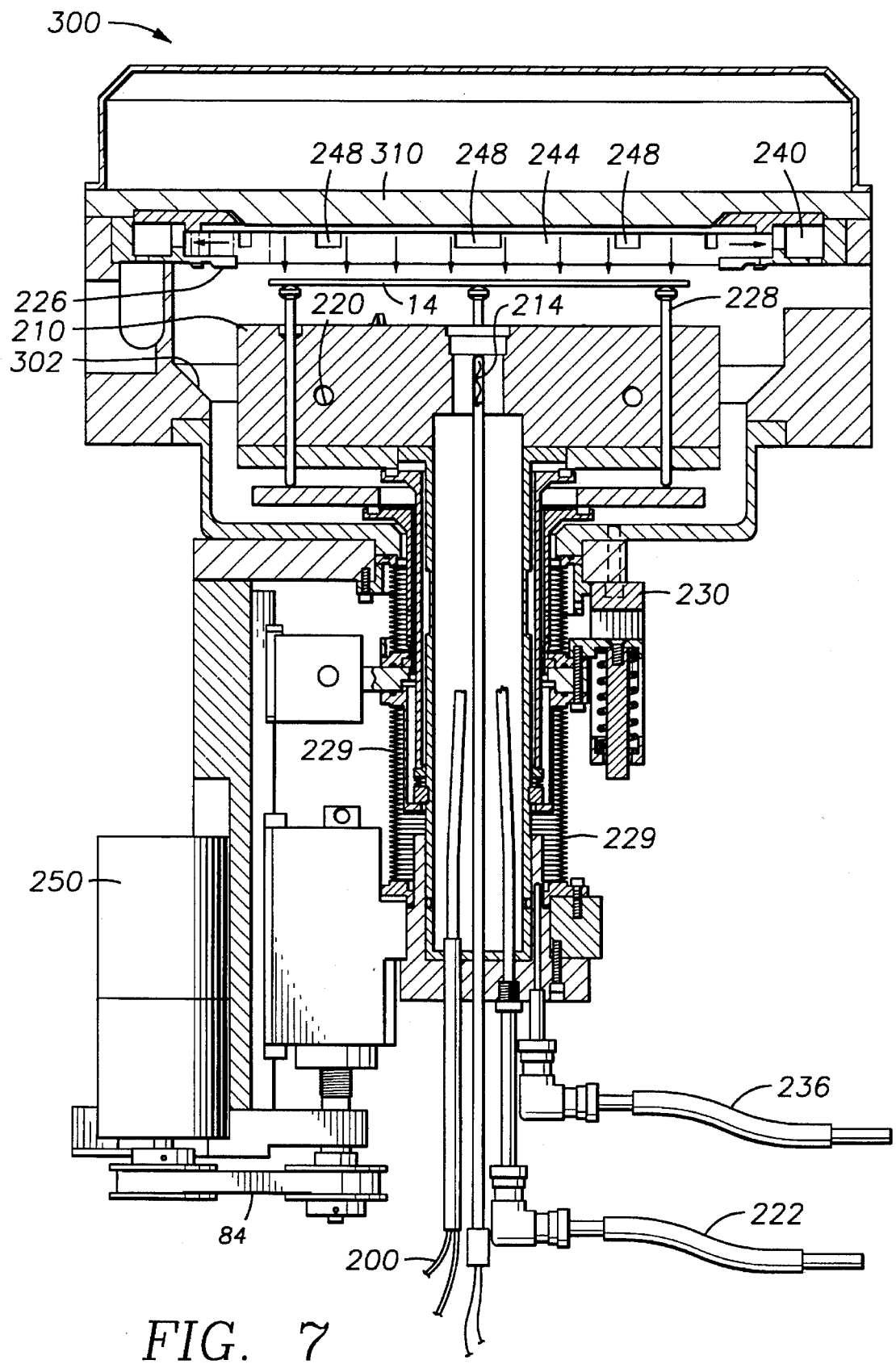
FIG. 7 is a cross sectional view, partially schematic, of a CVD chamber of the invention.

As shown in FIG. 7, a thermocouple 214 is inserted and held in contact with the underside of the heater at a distance of about 0.25 inch from the bottom of the wafer. The thermocouple 214 is held in place by a slight spring force and provides a control signal for the temperature controller. The thermocouple 214 is in a well which is at atmospheric pressure, which enhances the heat transfer between the heater 200 and the thermocouple 214 to provide a more accurate reading.

The temperature controller is a recipe driven proportional integral differential (PID) controller which anticipates the recipe steps which are about to occur and alters the response characteristic 8A of the heater to maintain a uniform temperature profile.

Figure 4:
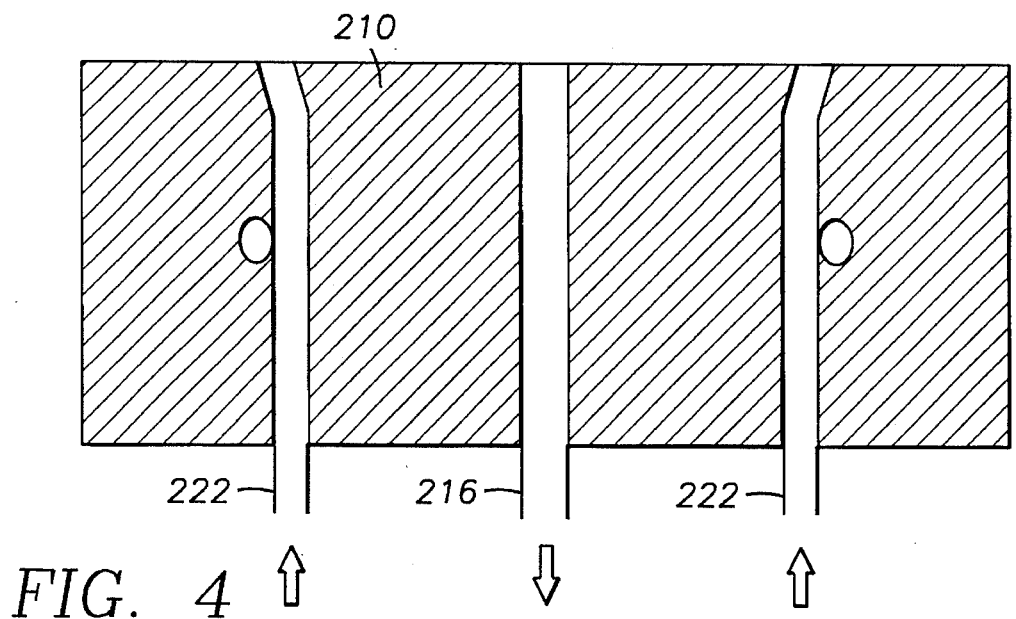
FIG. 4 is a cross sectional view of the susceptor mount of the invention.
Figure 5:
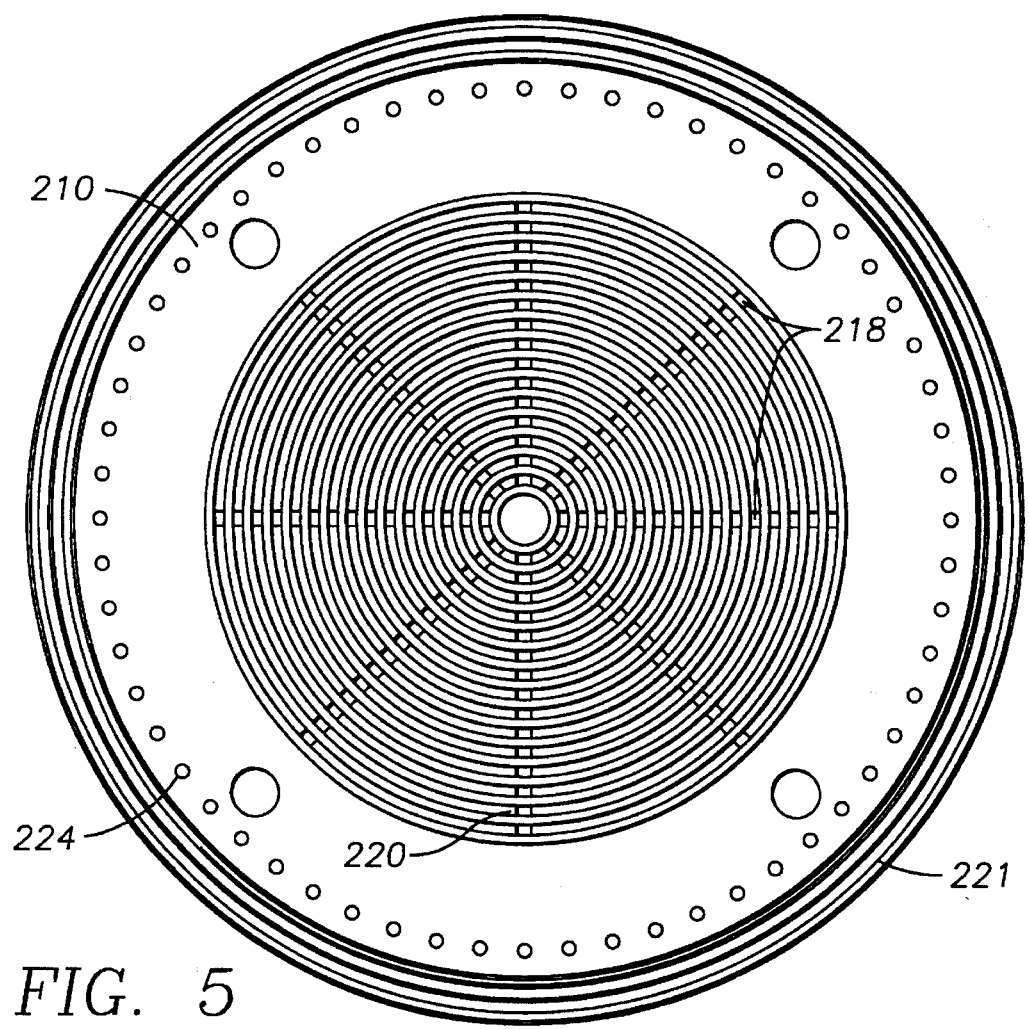
FIG. 5 is a top view of the susceptor plate of the invention.

FIG. 4 is a cross sectional view of the susceptor mount 210 and FIG. 5 is a top view of the susceptor mount 210.

Referring now to FIGS. 4 and 5, a vacuum line 216 is shown. The vacuum line 216 is connected to a source of vacuum (not shown) which is separate from the vacuum exhaust pump for the CVD chamber itself. The vacuum line 216 is connected to a plurality of openings 218 in the surface of the susceptor 210. These openings 218 in turn are located within small channels 220 in the surface of the susceptor 210. Thus when the vacuum is turned on, a substrate mounted onto the susceptor 210 is drawn down against the susceptor 210 uniformly. The vacuum openings 218 are connected to the channels 220 and are located so as to evenly distribute vacuum across the surface of the susceptor 210. The vacuum channels 220 do not extend to the edge of the substrate, but, for example, may extend across the susceptor 210 for about 7 inches when an 8 inch wafer is to be processed.

The pressure of the vacuum line 216 can be from about 1.5 Torr to about 60 Torr when the pressure of the chamber is about 80 Torr. The pressure in the vacuum feed line can be further adjusted by injecting an inert gas, such as argon, to adjust the center to edge uniformity of deposition onto the substrate. For example, increasing the pressure in the vacuum line 216 from about 2.5 Torr to about 10 Torr increases the heat transfer within the susceptor region and increases the film thickness and uniformity of the deposited film.

Shallow grooves may be added to the region outside the vacuum chuck area to reduce heat transfer near the edge of the wafer, which then reduces the thickness of the film being deposited at the edge of the wafer.

A purge gas line 222 is also present in the susceptor mount 210. A purge gas such as argon is passed into a plurality of purge gas openings 224 in the susceptor 210 that directs the purge gas against the edge of the substrate, thereby inhibiting the process gas from coming in contact with the wafer edge surface and depositing material such as tungsten thereon. About 120–360 openings can be evenly spaced about the periphery of the susceptor 210. The use of a purge gas to inhibit edge and backside deposition per se is known. However, as the purge gas then passes along the edge of the substrate and into the processing region of the chamber, a problem arises because the purge gas can cool the edge of the substrate and dilute the processing gas at the edge of the substrate, thereby reducing the deposition at the edge of the substrate. Thus a refractory purge guide has been added to the present CVD chamber in accordance with the present invention.

Figure 6:
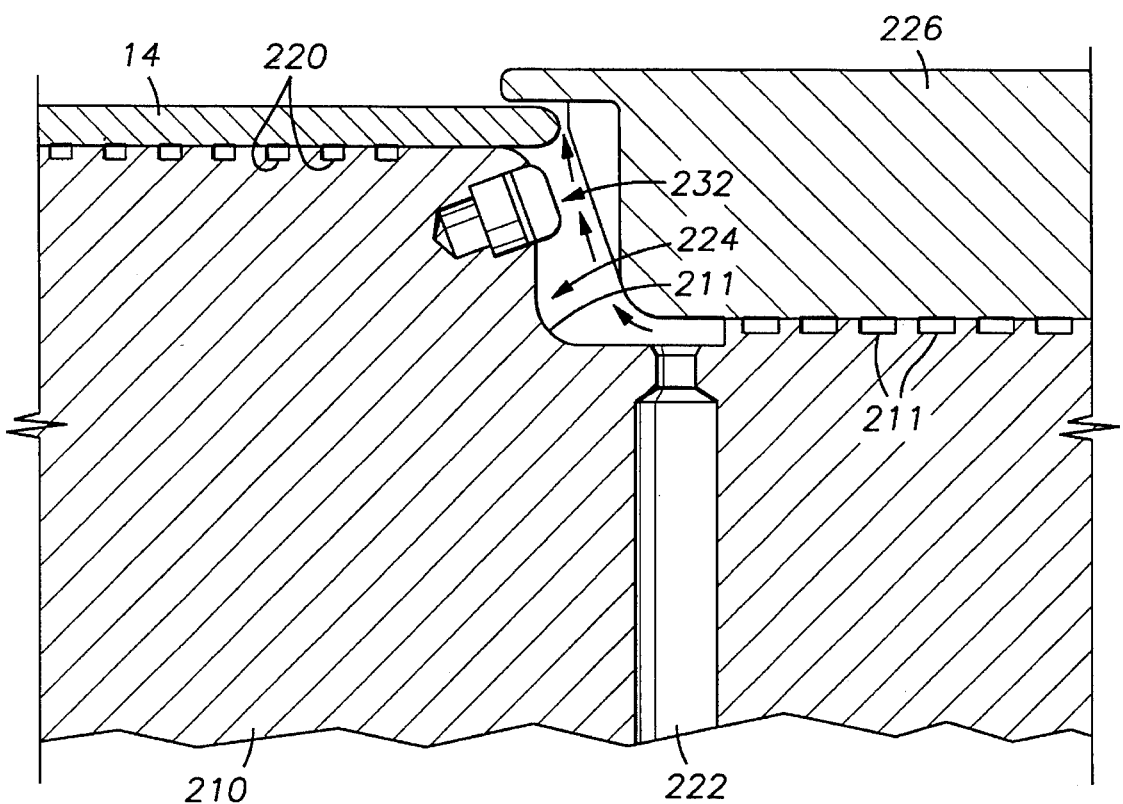
FIG. 6 is a cross sectional view of a purge guide in combination with a substrate to be processed mounted on a susceptor of the invention.

FIG. 6 is a cross sectional view of a purge guide 226 in combination with a wafer 14 to be processed mounted on a susceptor 210.

Referring to FIG. 6, a wafer 14 is supported by the susceptor 210. The purge guide 226 rests on the top of the susceptor 210 when the susceptor mount 210 is in its processing position. The purge gas feed line 222 feeds purge gas against the edge of the wafer 14 which is vacuum mounted on the susceptor 210. The purge guide 226 maintains a fixed gap above the wafer 14 through which the purge gases pass into the processing area of the CVD chamber. It is this fixed gap, which is on the order of 5–10 mils, which is critical in controlling the distribution of purge gas and maintaining the center to edge deposition uniformity on the substrate. The path of the purge gas is shown by the arrows. Suitably, the purge guide 226 is made of ceramic, such as aluminum oxide or aluminum nitride.

The edge of the aluminum susceptor 210 upon which the purge guide 226 rests during processing has a plurality of fine grooves 221, e.g., about 5–10 mils apart, to prevent sticking between the purge guide 226 and the susceptor 210. This sticking can occur because of the difference in coefficients of expansion between metal such as aluminum (susceptor) and ceramic (purge guide) parts; the aluminum expands about three times as much as the ceramic at processing temperatures as compared with room temperatures. The fine grooves 221 prevent the generation of particles when the purge guide 226 and the susceptor 210 are separated as the susceptor mount 210 is lowered after processing of the wafer 14 is complete.

Generally, purge gases are inert gases such as argon. However, a small amount of a reactive gas such as hydrogen can be added to the purge gas to enhance deposition at the edge of the substrate. In the event the purge gas does cool the edge of the substrate, or dilute the processing gas at the edge of the substrate, or if the purge guide overlies or shadows the periphery of the substrate thereby decreasing the deposition at the periphery of the top surface of the wafer, a reactive gas, such as hydrogen added to the purge gas, will react with, e.g., $WF_6$, to increase its dissociation and increase the amount of deposit on the edge of the wafer and overcome the above sources of non-uniformity of deposition.

FIG. 7 is a cross sectional view, partially schematic, of the CVD chamber 300 of the present invention.

The substrate 14 is brought into the chamber 300 of the invention by a robot blade through a slit valve in a sidewall of the chamber (not shown). The chamber 300 may be part of a vacuum processing system having a plurality of processing chambers connected to a central transfer chamber. The susceptor mount 210 is moveable vertically by means of a motor 250. The substrate 14 is brought into the chamber when the susceptor mount 210 is in a first position opposite the slit valve. The substrate 14 is supported initially by a set of pins 228 that pass through the susceptor mount 210 and are coupled to the susceptor mount 210 driven by a single motor assembly. A second purge line 236 can be added to protect the stainless steel bellows 229 from damage from corrosive gases. However, as the pins 228 rise along with the susceptor mount 210, they encounter a stop 230. As the susceptor mount 210 continues to rise to the processing position opposite the processing gas plate 310, the pins 228 sink into the susceptor mount 210 and the wafer 14 is deposited onto the susceptor plate 214. The susceptor vacuum supply line 216 shown in FIG. 4 is turned on, which affixes the substrate 14 to the susceptor 210. The susceptor mount 210 is then moved upwardly towards the processing gas plate 310, shown in dotted line, for processing the substrate 14. As it moves upwardly, the substrate 14 contacts the purge guide 226 and centers the purge guide 226 with respect to the affixed substrate 14. When the purge guide 226 is centered, it does not contact the wafer but maintains a fixed 5–10 mil gap with the wafer 14 for passage of purge gases between them. At the same time, the susceptor mount 210 is also centering the purge guide 226 as it travels upwardly. A set of bumper pins 232 as shown in FIG. 6 are used on the sidewall 211 of the aluminum susceptor mount 210 to minimize contact between the purge guide 226 and the susceptor mount 210 as the susceptor mount 210 moves vertically, thereby reducing the generation of particles in the event the susceptor mount 210 and the purge guide 226 rub against each other in passing.

When the susceptor mount 210 and the substrate 14 affixed thereto reach the processing position, the processing gas is turned on and deposition of tungsten or other film is begun. Spent process gases and by-product gases are exhausted by means of the exhaust system 240 from the chamber.

Figure 8:
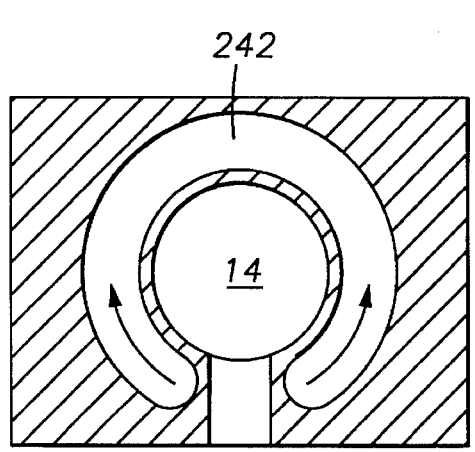
FIG. 8 is a top view of the exhaust channel of the chamber of the invention.

The prior art exhaust system is another cause of non-uniformity of the deposited film as we have discovered. The exhaust system 240 of the CVD chamber 300 cannot remove gases uniformly from the whole periphery of the substrate 14. As shown in FIG. 8, the chamber exhaust channel 242 is located between the susceptor mount 210 and the substrate 14 thereon, and the walls 302 of the chamber 300. However, because of the need to allow for ingress and egress of the substrate 14 through the slit valve, the exhaust channel 242 is blocked in the area of the slit valve, and the exhaust channel 242 does not completely surround the substrate.

FIG. 8 is a top view of the exhaust channel 242 in the CVD chamber of the invention. The presence of a slit valve cuts off a portion of the chamber exhaust channel 242 about the periphery of the wafer 14. Thus removal of exhaust gases is not uniform, which can distort the composition of spent and by-product gases in that area.

Figure 9:
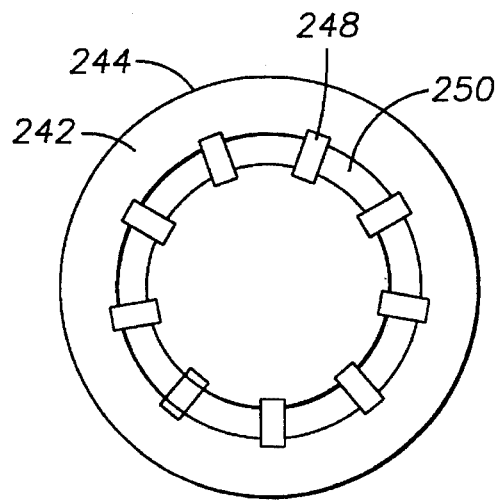
FIG. 9 is a top view of an exhaust pumping plate of the invention.

Thus, also in accordance with the present invention, an exhaust pumping plate 244 is provided as shown in FIGS. 7 and 9. A plurality of vertical openings 248 in the exhaust pumping plate 244 are connected by means of a channel 250 in the exhaust plate 244. The size of the openings 248 is slightly restrictive, which forces exhaust gases to back up into the channel 250 where they are uniformly distributed, and then they are drawn out of the chamber 300 by means of the chamber exhaust channel 242. Thus the exhaust gases are distributed more uniformly by the pumping plate 244 and gases are more evenly evacuated from about the periphery of the wafer 14.

The exhaust plate 244 is mounted in the chamber sidewalls 302 at about the position of the wafer 14 when it is in its processing position. Thus the exhaust gases pass into equally spaced vertical openings into a single channel 250 about the whole periphery of the wafer 14 during processing, and thus exhaust gases pass into the exhaust system 240 in a more uniform way.

When deposition is complete, the processing gas source is turned off, and the susceptor mount 210 is lowered again. As the susceptor mount 210 approaches the position at which the lift pins 228 will again protrude from the susceptor plate 214, the vacuum source connected to vacuum line 216 is turned off so that the processed wafer can be lifted by the pins 228 above the surface of the susceptor plate 214. The susceptor mount 210 and the wafer 14 are lowered to their initial position opposite the slit valve, so that the wafer 14 can be removed from the chamber.

Figure 10:
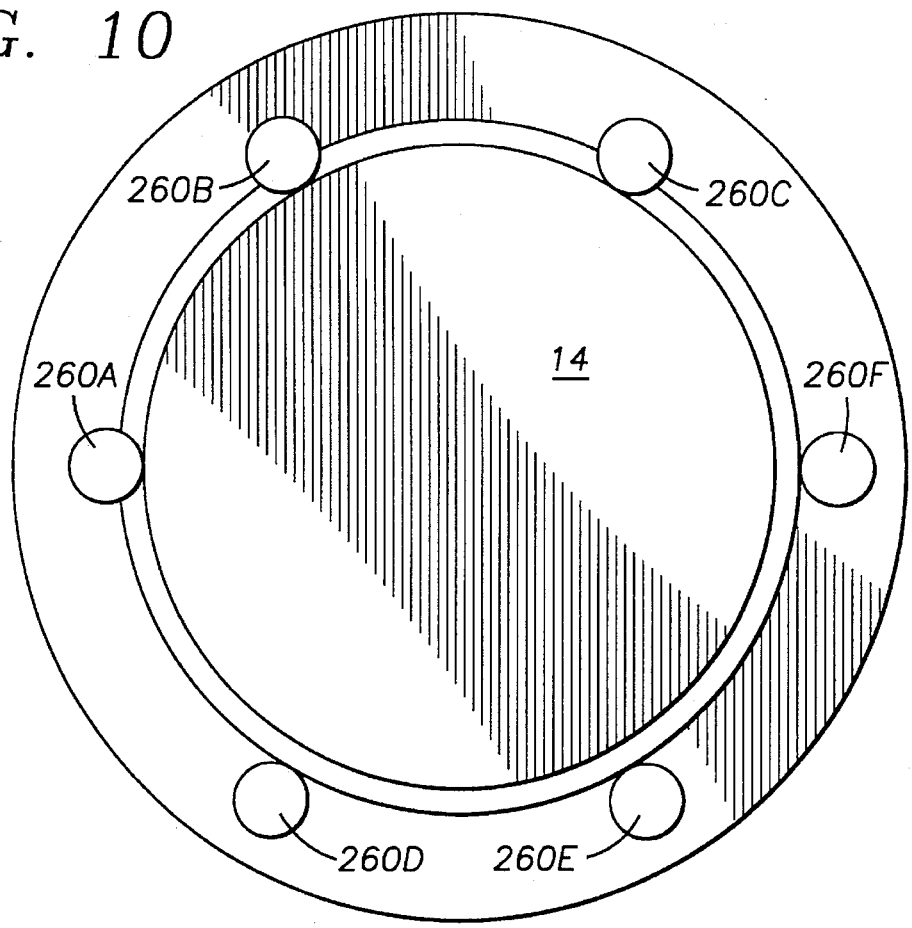
FIG. 10 is a top view of placement pins about a wafer.
Figure 11:
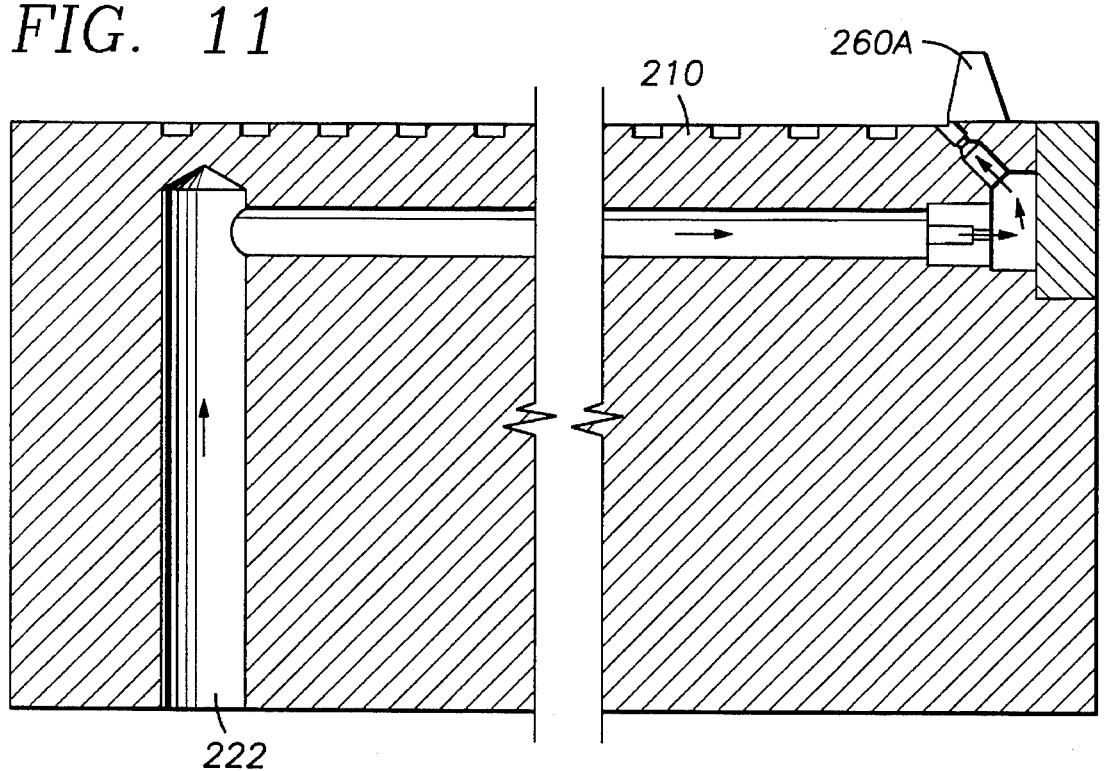
FIG. 11 is a cross sectional view of a purge pin affixed to a susceptor of the invention

An alternate embodiment of chamber 300 employs a plurality of integral placement pins 260 instead of a purge guide 226, as shown in FIGS. 10 and 11. The use of placement pins instead of the purge guide described hereinabove enables tungsten to be deposited over the entire top surface of the wafer, including the top edge of the beveled edge of the wafer, i.e., with zero edge exclusion.

FIG. 10 is a top view of a wafer 14 surrounded by placement pins 260 to set a purge gas passage therebetween.

The purge guide pins 260, six of them in the embodiment illustrated in FIG. 10, can be made of a refractory material such as aluminum oxide, or a metal such as aluminum. Three of the pins, 260A, 260B and 260C, register the wafer 14 so that the wafer edge is aligned with the pins. These pins 260A, 260B and 260C are set to the nominal wafer size (200 mm in diameter), and set the gap between the wafer 14 and the purge gas channel 262. Thus the gap is set to be optimized for the majority of wafers 14. If a particular wafer is smaller or larger than the nominal size, the gap about the wafer will vary from about 2–20 mils from one side to another. The remaining three pins, 260 D, E and F, are not in contact with the edge of a wafer and provide a fixed gap between the wafer and the pins so that the purge gas can pass between them. FIG. 11 is a cross sectional view of a placement pin 260A mounted on the susceptor plate 210. This embodiment eliminates the refractory purge guide, eliminates all shadowing of the wafer edge by the purge guide from deposition gases and eliminates a source of possible particle generation. By proper adjustment of the purge gas mixture, e.g., adding a reactive gas such as hydrogen, any inhomogeneities at the edge of the wafer may be compensated for.

The use of the present resistively heated susceptor improves uniformity of deposition because the susceptor remains at the processing temperature at all times. This reduces the temperature variations seen by the wafer and the chamber and improves the uniformity of deposition.

Although the present invention has been described in terms of specific embodiments, various substitutions of parts and materials and deposition conditions can be made as will be known to those skilled in the art. For example, the susceptor can comprise a susceptor mount and a face plate affixed thereto, the face plate having the openings for vacuum and purge gases described above, affixed to the susceptor mount having the gas lines therein, the gas lines connecting to the various openings in the face plate. Other variations will be apparent to those skilled in the art and are meant to be included herein. The scope of the invention is only to be limited by the following claims:

We claim:

1. A chemical vapor deposition chamber comprising a source of precursor gas, a susceptor having a surface for receiving a substrate thereon and a vacuum exhaust system, comprising:

(a) a resistance heater mounted within said susceptor;

(b) a vacuum feed line through said susceptor connected to a vacuum separate from the chamber exhaust vacuum for holding a substrate to said susceptor;

(c) a purge gas line extending through said susceptor and connected to a plurality of openings positioned beyond the edge of a substrate receiving surface on the susceptor; and (d) a purge guide to provide a fixed gap passage for purge gas between said purge guide and said substrate receiving surface on the susceptor.

2. A chamber according to claim 1 wherein said resistance heater has a single coil.

3. A chamber according to claim 2 wherein said resistance heating coil can provide a temperature across the susceptor of from about 250 C. to 650 C.

4. A chamber according to claim 3 wherein the heating coil can provide a temperature across the susceptor plate from its center to its edge that is constant within +/−2° C.

5. A chamber according to claim 2 wherein said vacuum feed line is additionally connected to a source of inert gas and a source of reactive gas to control the vacuum and temperature uniformity across the susceptor.

6. A chamber according to claim 1 wherein the surface of the susceptor has a plurality of openings connected to channels which are connected to a vacuum feed line through said susceptor, and said channels and openings are disposed within the area of the susceptor occupied by the substrate during processing.

7. A chamber according to claim 6 wherein the susceptor has a plurality of fine grooves beyond the area of the purge gas openings for supporting said purge guide without sticking.

8. A chamber according to claim 1 wherein a set of placement pins on the susceptor guide a substrate to an optimal position on the susceptor, to fix a gap between the edge of the substrate and the plurality of purge gas openings in the susceptor.

9. A chamber according to claim 1 further comprising an exhaust plate in said exhaust system having a plurality of small vertical passages that connect to a channel about the whole circumference of the back of said plate so that exhaust gases are more uniformly withdrawn from about said substrate.

10. A chamber according to claim 1 wherein the susceptor has a face plate affixed thereto having openings that connect to the purge and vacuum lines in said susceptor.

11. The chemical vapor deposition chamber of claim 1, wherein;

the susceptor includes a groove therein;

said resistance heating coil is received in said groove; and a channel is received over said coil and affixed to the susceptor.

12. The chemical vapor deposition chamber of claim 11, wherein said channel is press fit into said groove.

13. The chemical vapor deposition chamber of claim 11, wherein said channel is welded to the susceptor.

14. A chemical vapor deposition chamber comprising a source of precursor gas, a susceptor having a surface for receiving a substrate thereon and a vacuum exhaust system, comprising:

(a) a heater mounted within said susceptor;

(b) a vacuum feed line through said susceptor connected to a vacuum separate from the chamber exhaust vacuum for mounting a substrate to said susceptor;

(c) a purge gas line extending through said susceptor and connected to a plurality of openings extending through the susceptor at a position beyond the edge of the substrate receiving surface;

(d) means to provide a fixed gap passage for purge gas with said substrate;

(e) a refractory purge guide supported on said susceptor and providing a fixed gap between said susceptor and the substrate to provide a purge gas passage; and (f) said susceptor including a plurality of fine grooves beyond the area of the purge gas openings for supporting said purge guide without sticking.

15. The chamber of claim 2, wherein said vacuum feed line communicates with at least one groove in the substrate receiving surface of the susceptor;

a source of reactive gas is ported to said vacuum feed line; and reactive gas is supplied from the reactive gas source to the vacuum feed line and thus to said groove.

16. The chamber of claim 2, wherein said vacuum feed line communicates with at least one groove in the substrate receiving surface of the susceptor;

a source of inert gas is ported to said vacuum feed line; and inert gas is supplied from the inert gas source to the vacuum feed line and thus to said groove.

17. A chemical vapor deposition chamber including a gas supply, a susceptor and an exhaust system, comprising:

(a) a purge gas line extending through the susceptor and connected to a plurality of openings positioned beyond the edge of a substrate when mounted on the susceptor, and (b) a purge guide to provide a fixed gap passage for purge gas flowing past the substrate.

18. The chemical vapor deposition chamber of claim 17, further including;

a purge gas channel extending circumferentially about the edge of the substrate and providing said fixed gap passage.

19. The chemical vapor deposition chamber of claim 17, wherein said purge guide includes a lip portion extending inwardly of the substrate receiving surface of the susceptor to provide said fixed gap passage between said lip portion and a surface of the substrate.

20. The chemical vapor deposition chamber of claim 18, further including a resistance heating coil mounted within the susceptor.

21. The chemical vapor deposition chamber of claim 18, further including a vacuum feed line extending through the susceptor and providing a vacuum to at least one groove disposed in the substrate receiving surface of the susceptor.

22. The chemical vapor deposition chamber of claim 21, further including a source of inert gas ported to said vacuum feed line.

23. The chemical vapor deposition chamber of claim 21, further including a source of reactive gas ported to said vacuum feed line.

24. The chemical vapor deposition chamber of claim 21, further including a source of reactive gas and a source of inert gas ported to said vacuum feed line.

25. The chemical vapor deposition chamber of claim 17, wherein the purge guide includes a lip portion extending inwardly of the substrate receiving surface of the susceptor to provide said fixed gap passage between said lip portion and a surface of the substrate.

26. The chemical vapor deposition chamber of claim 25, wherein said lip overhangs the upper surface of a substrate received on the susceptor.

27. The chemical vapor deposition chamber of claim 17 further including;

a passage extending inwardly of the susceptor and forming an ambient pressure well terminating immediately below the substrate receiving surface of the susceptor; and a thermocouple received in said well.

28. A chemical vapor deposition chamber comprising a source of process gas, a heated susceptor and a vacuum exhaust system, comprising:

(a) a purge gas source providing a purge gas to the periphery of a substrate received on the susceptor;

(b) a purge guide for providing a fixed gap passage along the surface of the substrate for purge gas flowing past the substrate; and wherein (c) said purge gas source provides the purge gas through the susceptor at a position between the edge of a substrate received on the susceptor and said purge guide.

29. The chemical vapor deposition chamber of claim 28, wherein said fixed gap is located above the deposition receiving surface of the substrate.

30. The chemical vapor deposition chamber of claim 28, wherein said purge guide includes a lip portion; and said lip portion cooperates with the deposition receiving surface of a substrate received on the susceptor to provide said fixed gap passage.

31. The chemical vapor deposition chamber of claim 28, wherein:

the susceptor includes a purge guide receiving portion thereon; and said purge guide receiving portion includes at least one groove therein.

32. A chemical vapor deposition chamber comprising a source of process gas, a susceptor having a substrate receiving surface thereon and an exhaust system, comprising:

(a) a purge gas source providing a purge gas to the periphery of a substrate received on the susceptor;

(b) a purge gas passage located adjacent to the edge of a substrate received on the susceptor; and wherein (c) said purge gas source provides the purge gas between the edge of a substrate received on the susceptor and the purge gap passage.

33. The chemical vapor deposition chamber of claim 32, wherein said purge gas source includes a gas supply, a plurality of purge gas ports, and a purge gas line extending between said purge gas ports and said purge gas source.

34. The chemical vapor deposition chamber of claim 33, wherein said purge gas line extends through the body of said susceptor.

35. The chemical vapor deposition chamber of claim 33, wherein said purge gas ports include at least 120 individual ports spaced evenly about the perimeter of the substrate receiving surface.

36. The chemical vapor deposition chamber of claim 32, further including a purge guide located on the susceptor; and said purge gas channel is located between said purge guide and a substrate received on the susceptor.

37. The chemical vapor deposition chamber of claim 36, wherein said purge guide includes an inwardly projecting lip portion.

38. The chemical vapor deposition chamber of claim 37, wherein said lip overhangs the edge of a substrate received on the susceptor.

39. The chemical vapor deposition chamber of claim 36, further including:

a purge guide receiving surface on the susceptor; and at least one groove extending inwardly of said purge guide receiving surface.

40. The chemical vapor deposition chamber of claim 32, wherein said susceptor is provided from a solid block of metal.

41. The chemical vapor deposition chamber of claim 40, wherein said susceptor includes a groove therein;

a heating element is received in said groove; and a cover is disposed over said heating element.

42. The chemical vapor deposition chamber of claim 41, wherein said cover is press fit into said groove.

43. The chemical vapor deposition chamber of claim 32, wherein said exhaust system includes a plurality of spaced apertures ported to a chamber exhaust manifold.

44. The chemical vapor deposition chamber of claim 43, wherein said manifold extends circumferentially within the chamber less than 360°.

45. The chemical vapor deposition chamber of claim 28, wherein said purge guide is received on the susceptor.

46. The chemical vapor deposition chamber of claim 43, wherein said exhaust manifold extends around the inner perimeter of the chamber and said apertures are evenly spaced about the inner perimeter of said exhaust manifold.

47. The chemical vapor deposition chamber of claim 25, wherein:

the susceptor includes a purge guide receiving surface thereon;

said purge guide receiving surface includes at least one grove therein; and said purge guide is received on said purse guide receiving portion.

* * * * *